United States Patent [19]

Ohmura et al.

[11] 4,392,013
[45] Jul. 5, 1983

[54] FINE-PATTERNED THICK FILM CONDUCTOR STRUCTURE AND MANUFACTURING METHOD THEREOF

[75] Inventors: Kaoru Ohmura; Takeo Kimura; Tetsuhiro Kusunose, all of Fuji, Japan

[73] Assignee: Asahi Kasei Kogyo Kabushiki Kaisha, Osaka, Japan

[21] Appl. No.: 219,155

[22] Filed: Dec. 22, 1980

[30] Foreign Application Priority Data

| Dec. 27, 1979 | [JP] | Japan | 54-169266 |
| Dec. 27, 1979 | [JP] | Japan | 54-169267 |
| Dec. 27, 1979 | [JP] | Japan | 54-169268 |
| Jan. 25, 1980 | [JP] | Japan | 55-6956 |
| Jan. 25, 1980 | [JP] | Japan | 55-6958 |
| Aug. 20, 1980 | [JP] | Japan | 55-113410 |
| Aug. 21, 1980 | [JP] | Japan | 55-113979 |

[51] Int. Cl.³ .......................................... H05K 1/02
[52] U.S. Cl. .................................. 174/68.5; 219/216; 219/543; 336/200; 427/96
[58] Field of Search .................... 219/216 PN, 543; 174/68.5; 336/200; 427/96, 98

[56] References Cited

U.S. PATENT DOCUMENTS

| 3,269,861 | 8/1966 | Schneble et al. | |
| 3,432,922 | 3/1969 | Yamada | 219/543 X |
| 4,017,890 | 4/1977 | Howard et al. | 174/68.5 X |
| 4,136,274 | 1/1979 | Shibata et al. | 219/216 PH |
| 4,187,485 | 2/1980 | Wollnik | 336/200 X |
| 4,250,375 | 2/1981 | Tsutsumi et al. | 219/216 |
| 4,259,564 | 3/1981 | Okkubo et al. | 219/216 PH |
| 4,298,786 | 11/1981 | Marciniec | 219/543 X |

Primary Examiner—R. R. Kucia
Attorney, Agent, or Firm—Sprung, Horn, Kramer & Woods

[57] ABSTRACT

In manufacturing a fine-patterned thick film conductor structure, a thin film conductor layer having a film thickness of 0.1–10 μm is formed on an insulating substrate and conductive material is then electroplated on the thin film conductor layer to the thickness of 34.9–190 μm under the condition of a cathode current density of no less than 5 A/dm². In patterning the conductors, a film thickness-to-conductor interspacing ratio is selected to be no less than 1.4 to prevent widthwise thickening of the conductors in the electroplating process. Resulting conductor structure has a circuit density of no less than 5 lines/mm and a film thickness of 35–200 μm. It is useful for a high density printed circuit board and a miniature coil.

11 Claims, 17 Drawing Figures

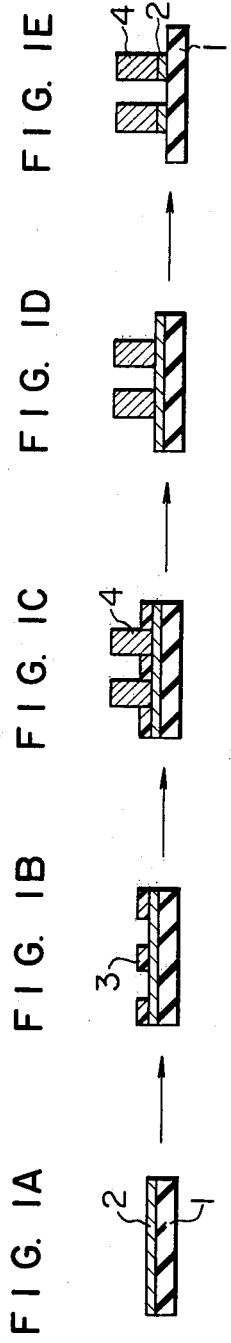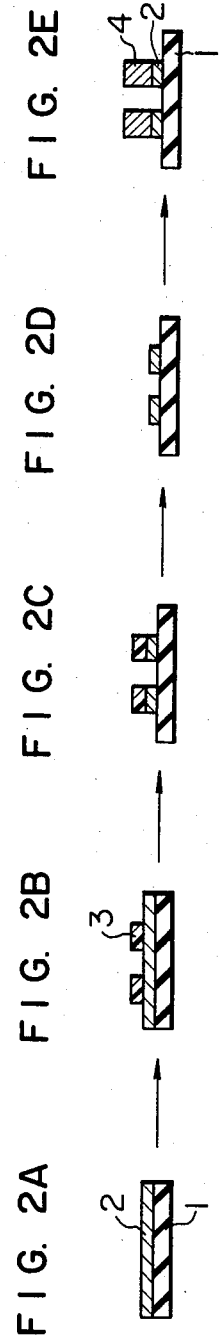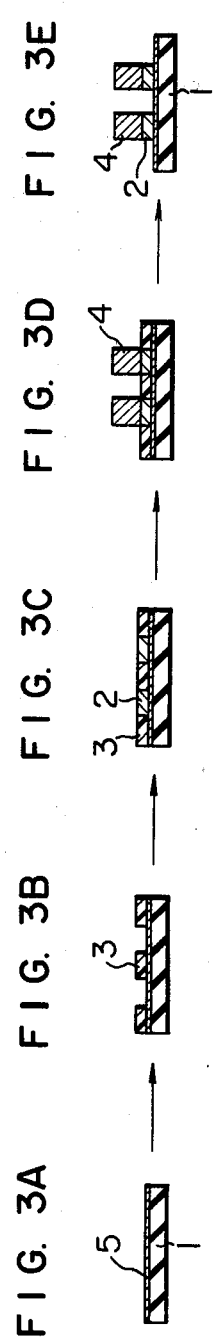

FINE-PATTERNED THICK FILM CONDUCTOR STRUCTURE AND MANUFACTURING METHOD THEREOF

BACKGROUND OF THE INVENTION

The present invention relates to a fine-patterned thick film conductor structure having high circuit density and high reliability, and a method for manufacturing the same.

The fine-patterned thick film conductor structure has been required in the fields of small size coils, high package density connectors and high circuit density wirings in which a high magnitude of current is used. In the manufacture of a coil, a wire winding method is usually used but it is difficult to manufacture a small size coil by this method or the wire wound small size coil manufactured by this method has a variance in the winding. A printed coil having copper foils of 35 μm thickness etched cannot provide a fine pattern because of side etching which extends twice as long as the thickness of the etched film, and it provides a pattern of 2-3 lines/mm at most. It is thus difficult to manufacture the small size coil by this method. This technique is disclosed in the U.S. Pat. No. 3,269,861, for example.

A fine-patterned thin film conductor structure can be manufactured by photoetching a very thin copper foil or additive method by photoforming. However, when it is thickened by ordinary electroless plating method of electroplating method, shortcircuiting occurs due to the side-thickening so that the fine-patterned thick film conductor structure is not produced. While a thick film plating method using walls to prevent side-thickening of thick plating has been proposed, it is not easy to form the thick-film walls on the fine-patterned conductor structure. The examples are described in Japanese Patent Applications Laid-Open Nos. 53-139175 and 53-140577.

However, as the miniaturization of motors for use in cassette tape recorders or VTR's (video tape recorders) has been developed, the development of fine coils having thick film fine patterns of 10-20 lines/mm has been required.

While the fine-patterned thick film conductor structures having circuit density of 5 lines/mm or more and film thickness of 35 μm or more have been frequently required, no product having acceptable characteristics has been developed.

SUMMARY OF THE INVENTION

It is an object of the present invention to provide a fine-patterned thick film conductor structure having a high circuit density and a method for manufacturing the same.

It is another object of the present invention to provide a fine-patterned thick film conductor structure having a low resistance and a method for manufacturing the same.

It is a further object of the present invention to provide a micro-coil having a high performance and a high reliability and a method for manufacturing the same.

The inventors of the present invention have found that a fine-patterned thick film conductor structure having a high circuit density and a high reliability, which is free from the shortcircuiting due to the side-thickening of conductors can be produced by first forming a thin film conductor structure having a film thickness of 0.1-10 μm on an insulating substrate and then thickening the conductors by electroplating in a pattern under the condition of a cathode current density of no less than 5 A/dcm$^2$ (amperes per square decimeter). The present invention provides a fine-patterned thick film conductor structure having an insulating substrate, a thin film conductor layer disposed thereon and an electroplated layer having a thickness of 34.9-190 μm disposed thereon. The present invention further provides a method for manufacturing a fine-patterned thick film conductor structure comprising the steps of forming a patterned or unpatterned thin film conductor layer having a film thickness of 0.1-10 μm on an insulating substrate and electroplating the surface of the thin film conductor layer in a fine pattern with conductive material to the thickness of 34.9-190 μm under the condition of a cathode current density of no less than 5 A/dm$^2$, with the electroplating step being carried out directly when the thin film conductor layer has been patterned and through a plating resist when the thin film conductor layer has not been patterned. The plating time is determined depending upon the film thickness and the cathode current density.

The above and other objects, features and advantages of the present invention will be apparent from the following description of the invention taken in conjunction with the accompanying drawings wherein:

BRIEF DESCRIPTION OF THE DRAWINGS

FIGS. 1A through 1E illustrate the manufacturing steps of the fine-patterned thick film conductor structure in accordance with one embodiment of the present invention;

FIGS. 2A through 2E illustrate the manufacturing steps in accordance with another embodiment of the present invention;

FIGS. 3A through 3E illustrate the manufacturing steps in accordance with a further embodiment of the present invention;

DETAILED DESCRIPTION OF THE PREFERRED EMBODIMENTS

Figure 4:
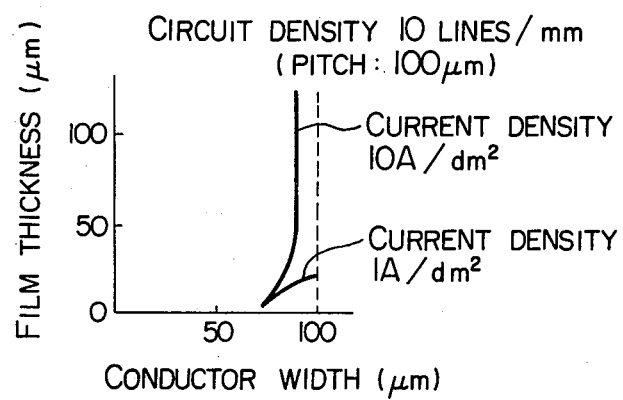
FIG. 4 shows a characteristic of film thickness versus conductor width in electroplating method.

Referring to FIGS. 1A through 1E, a method for manufacturing a fine-patterned thick film conductor structure in accordance with one embodiment of the present invention will now be generally explained.

As shown in FIG. 1A, a thin film conductor layer 2 is formed on an insulating substrate 1, plating resist 3 is applied on the areas other than land areas of the circuit pattern (FIG. 1B), electroplated conductor layers 4 are formed on the land areas (FIG. 1C), the resist 3 is removed (FIG. 1D), and the thin film conductor layers on the areas other than the land areas are etched away (FIG. 1E).

Referring to FIGS. 2A through 2E, a manufacturing method in accordance with another embodiment of the present invention is explained. As shown in FIG. 2A, the thin film conductor layer 2 is formed on the insulating substrate 1, the plating resist 3 is applied on the land areas of the circuit pattern (FIG. 2B), the areas other than the land areas are etched away (FIG. 2C), the resist 3 is removed (FIG. 2D), and the electroplated conductive layer 4 is formed on the land area (FIG. 2E).

Referring to FIGS. 3A through 3E, general steps of a manufacturing method in accordance with a further embodiment of the present invention are explained.

As shown in FIG. 3A, an activated layer 5 for electroless plating is formed on the insulating substrate 1, the resist 3 is applied on the areas other than the land areas of the circuit pattern (FIG. 3B), an electroless plated thin film conductor layer 2 is formed on the land areas (FIG. 3C), the electroplated conductor layer 4 is formed thereon (FIG. 3D), and thereafter, if required the resist 3 is removed for completion (FIG. 3E).

In the respective embodiments described above, when the land areas are thickened by the electroless plating to a desired thickness, e.g. 34.9–190 μm, for the fine-patterned thick film conductor structure (of no less than 5 lines/mm in circuit density and no less than 35 μm in film thickness), widthwise thickening occurs to the extent beyond the film thickness irrespective of the substrate to be plated. As a result, the fine-patterned conductor structure is not produced. When the electroplating method is used for thickening with an ordinary current density which is less than 3 A/dm$^2$, the widthwise thickening occurs to the extend beyond the film thickness and the thickness of plating is ununiform. As a result, it is difficult to produce the fine-patterned conductor structure.

In order to resolve the above difficulties, the inventors of the present invention made extensive studies and found that the control of a cathode current density for the electroplating is an important factor. A preferable cathode current density is no less than 5 A/dm$^2$, and more preferably no less than 6 A/dm$^2$, and further preferably no less than 8 A/dm$^2$. While a detailed reason therefor has not been proved, with the cathode current density shown above, the widthwise thickening is reduced irrespective of the substrate to be plated and a patterned conductor of uniformed thickness is produced. When the cathode current density is 3 A/dm$^2$ or less, the widthwise thickening occurs and the thickness of the plated film is non-uniform. The cathode current density may be as high as possible. If blackening occurs due to plating with continuous flow of current, a pulsive current may be used for plating.

If a ratio of conductor thickness to conductor space exceeds 1.4, especially 2.0 with the above cathode current density, saturation occurs in the widthwise thickening and the plating selectively occurs only thicknesswise. That is, there exists a correlation between the thickness-to-interspacing ratio and the side-thickening of plating. FIG. 4 shows characteristic curves of film thickness versus conductor width with parameters of cathode current density. This phenomenon does not occur when the cathode current density is low but occurs only when the cathode current density is higher than the value set forth above.

The suppression of the widthwise thickening is preferably carried out by eliminating a potential difference between adjacent lands of the pattern in the plating step. The pattern may be designed to eliminate the potential difference or a manufacturing process which does not cause a potential difference may be used. More specifically, the pattern is preferably designed such that every portion of the pattern has the same resistance from the plating electrode.

As described above, by plating with the high cathode current density and designing the pattern such that the ratio of the conductor thickness to the conductor space is no less than 1.4, the fine-patterned conductor structure having the film thickness of no less than 35 μm and the circuit density of no less than 5 lines/mm, which have been impossible to attain heretofore, can be provided.

When the present invention is to be applied to a printed circuit board, the fine-patterned thick film conductor structure may be formed on only one side of the insulating substrate, or may be formed on both sides thereof as required. When they are formed on both sides of the substrate, the insulative substrate has to be drilled and thru-hole connections have to be made. When a plurality of patterns are to be formed on one insulating substrate, it is easier and preferable to form the patterns on both sides of the insulating substrate and connect them by thru-hole connections.

The insulating substrate used in the present invention may be ceramic, glass, ferrite, laminated board, film or insulator coated on a metal plate, and the film is especially preferable. When the films are used in a laminated structure, packaging density of wires increases and the structure has a flexibility. Therefore, it can be mounted in various spaces. The film structure may be any film such as polyester film, epoxy film, polyimide film, polyparabanic acid film or triazin film. The polyimide film, polyparabanic acid film and triazin film are preferable for their flexibility and heat resistance. The thickness of the film substrate is preferably as thin as possible from the standpoint of high package density but too thin film substrate jeopardizes the workability. A preferable range is 5–50 μm, more preferably 10–25 μm.

As required, in order to enhance the bonding of the insulating substrate and the conductor layer, an adhesive material layer may be formed on the insulating substrate and the conductive thin film may be deposited thereon. The adhesive material may be polyester-isocianate resin, phenol resin-butyral, phenol resin-nitrile rubber, epoxy-nylon, or epoxy-nitrile rubber having high heat resistance, humidity resistance and adhesive force. The epoxy-nitrile rubber and phenol resin-nitrile rubber are particularly preferable. Preferable range of the thickness of the adhesive material is 1–20 μm, more preferably 2–10 μm, from the view points of high packaging density and high adhesive force.

The conductor used in the present invention may be any conductor. Preferable conductors are silver, gold, copper, nickel and tin, and the copper is most preferable from the view points of conductivity and economy.

The method for forming the thin film conductor layer having the thickness of 0.1–10 μm in the present invention may be vapor deposition method, sputtering method, ion plating method, electroless plating method or copper film application method. The thin film conductor layer may have previously been patterned in a fine pattern prior to the electroplating, or a photoresist mask may be formed on the unpatterned thin film conductor layer and the fine pattern is electroplated and then the areas of the thin film conductor layer other than the land areas of the fine pattern may be removed by etching. The film thickness in this case may be 0.1–10 μm and side etching may be neglected because it is minor.

When the thickness of the underlying thin film conductor layer is 0.1 μm or less, uniform electroplating is hard to attain, and when it is 10 μm or more it is difficult to manufacture the fine patterned structure. Preferable range is, therefore, 0.1–10 μm, more preferably 0.2–5 μm, and further preferably 1–5 μm.

The material of electroplating may be any conductor such as silver, gold, copper, nickel or tin. The copper is preferable from the view points of conductivity and economy. The copper electroplating method may be copper cyanide plating, copper pyrophosphoric acid plating, copper sulfate plating or copper borofluoride plating. The pyrophosphoric acid plating and the copper sulfate plating are particularly preferable. The copper pyrophosphoric acid plating is the most preferable. Important factors for preventing the side-thickening by plating when the fine-patterned lands are electroplated are: (a) the cathode current density, (b) the conductor thickness-to-conductor spacing ratio and (c) the potential difference between lands. Of those, the factors (a) and (b) are significant. Those factors should be selected to the values set forth above.

According to a particularly preferable aspect of the manufacturing method of the present invention, there is provided a method for manufacturing a fine-patterned thick film conductor structure comprising (a) a step of activating an insulating substrate for the electroless plating, (b) a step of applying resist to the areas other than the land areas, (c) a step of forming conductor pattern having the thickness of 1-10 μm on the land areas by electroless plating, and (d) a step of electroplating conductive material on the thin film conductor pattern under the condition of a cathode current density of no less than 5 A/dm$^2$.

According to another aspect of the present invention, there is provided a method for manufacturing a fine-patterned thick film conductor structure comprising (a) a step of forming a metal layer having the thickness of 50 A-1 μm on the entire surface of an insulating substrate, (b) a step of applying resist to the areas other than the land areas, (c) a step of forming a conductor layer having the thickness of 1-10 μm on the land areas by electroless plating, (d) a step of removing the resist, (e) a step of etching away the exposed metal layer other than the land areas, and (f) electroplating the conductor layer under the condition of a cathode current density of no less than 5 A/dm$^2$. In accordance with the present method, the plating activating step is effected in a dry step so that the uniformity and the bonding force of the electroless plating layer are enhanced.

According to a further aspect of the present invention, there is provided a method for manufacturing a fine-patterned thick film conductor structure comprising (a) a step of applying resist on the areas of an insulating substrate other than the land areas, (b) a step of forming a metal layer having the thickness of 50 A-1 μm on the entire surface of the insulating substrate, (c) a step of removing the resist and the metal layer on the resist, (d) a step of forming a conductor layer on the remaining metal layer by electroless plating, and (e) electroplating the resulting thin film pattern having the thickness of 1-10 μm with conductive material under the condition of a cathode current density of no less than 5 A/dm$^2$. According to the present method, the etching step in the previous method can be omitted.

For further reliability, the bonding of the land areas may be enhanced by a thermal process after the electroplating step or a protective layer of polymer may be formed, as required.

The present invention thus for described can provide a fine-patterned thick film conductor structure having the circuit density of no less than 5 lines/mm and the film thickness of 35-200 μm, which has been heretofore considered impossible to attain. The present invention is particularly advantageous in providing a conductor structure having a conductor-to-conductor spacing of 0.5-100 μm, more particularly 1-50 μm and further particularly 1-10 μm.

Figure 5:
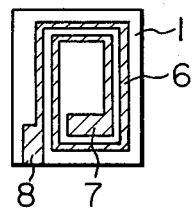
FIG. 5 is a plan view illustrating the application of the present invention to a coiled conductor circuit.

The fine-patterned thick film conductor structure of the present invention is useful in the fields of miniature coils, high packaging density connectors and high density circuits in which a relatively high current capacity is required. FIG. 5 shows an application of the present invention to a planar coil. Referring to FIG. 5, spiral conductor circuits 6 are formed on both sides of an insulating planar substrate 1 in such a polarity that the directions of the currents in both sides are same, and the circuits on both sides are electrically interconnected by thruhole connections 7 and connected to terminals 8.

The characteristic of the coil is determined by ampere-turn, that is, the number of turns and the magnitude of current. For the planar coil which uses the planar substrate, the wiring density of the spiral-patterned coil, the width of the conductor and the film thickness are important factors. A cylindrical substrate may be used depending on the application. In order to provide the miniature coil, it is necessary to increase the wiring density and under that requirement it is necessary to increase the width of the conductor and the film thickness. By forming the fine-patterned thick film conductor structure of the present invention in the spiral pattern, the high performance miniature coil can be provided.

In order to make the embodiments of the present invention more clear, specific examples are described hereinbelow, although the present invention is not limited to those examples but various modifications can be made.

EXAMPLE 1

Dupont polyimide film called "Kapton" (having a dimension of 5 cm × 5 cm and a thickness of 25 μm) was used as a substrate. It was dipped in 10% aqueous solution of sodium hydroxide, and processed with hydrochloric acid solution of stannous chloride and then with hydrochloric acid solution of palladium chloride, and then it was dried. Thereafter, Eastman Kodak negative photoresist "Microresist 752" was applied to have dried film thickness of 5 μm, prebaked, exposed to a high voltage mercury lamp through a circuit pattern mask, developed by developing liquid and rinse liquid, dried and postbaked to form resist on the areas other than land areas. Then, using electroless copper plating bath "CP-70" prepared by Shipley Co. of U.S.A., copper was electroless plated to the land areas to a thickness of 5 μm. The resulting patterned thin film was plated with copper by electroplating using Harshaw-Murata pyrophosphoric acid copper plating bath at 55° C., pH of 8.4–9.0 under the condition of a cathode current density of 14 A/dm$^2$ while controlling the plating time to obtain the plating thickness of 50 μm. The resulting fine-patterned thick film conductor structure had a uniform film thickness within ±5% variance (namely, the thickness of the film was 50±2.5 μm), the conductor-to-conductor spacing of 15 μm, the conductor width of 52 μm and the circuit density of 15 lines/mm, where the plating time was fifteen minutes.

EXAMPLE 2

On both sides of Esso Chemical polyparabanic acid film "Tradron" (having a dimension of 5 cm × 5 cm and a thickness of 25 μm), phenol resin-nitrile rubber adhesive material "XA-564-4" prepared by Bostik Japan Co. was applied to have dried thickness of 5 μm on each side, and heated to 180° C. for 30 minutes. Then, thru-holes were punched and the substrate was processed with hydrochloric acid solution of stannous chloride and the with hydrochloric acid solution of palladium chloride, and then it was dried. Thereafter, Eastman Kodak negative photoresist "Microresist 752" was applied to have a dried film thickness of 3 μm on each side, prebaked, exposed to a high voltage mercury lamp through a circuit pattern mask, developed by developing liquid and rinse liquid, dried and postbaked to form resist on the areas other than the land areas. Then, copper was electroless plated on the land areas to the thickness of 3 μm using Muromachi Kagaku Kogyo Co. Ltd. electroless copper plating both "MK400". The resulting patterned thin film was electroplated with copper using Harshaw-Murata pyrophosphoric acid copper plating bath to the thickness of 35 μm under the condition of the cathode current density of 7 A/dm². The resulting fine-patterned thick film conductor structure having circuit patterns on both sides and interconnected by thru-hole connections had the film thickness with the uniformity within ±5% variance, the conductor-to-conductor spacing of 20 μm and the circuit density of 15 lines/mm. Striped patterns were used to eliminate the potential difference.

EXAMPLE 3

Applied to Dupont polyimide film "Kapton" (having a dimension of 5 cm×5 cm and a thickness of 25 μm) was Bostik phenol resin-nitrile rubber adhesive material "XA-564-4" to the thickness of 5 μm (dried film thickness), it was heated to 180° C. for 30 minutes. Then, Eastman Kodak negative photoresist "Microresist 752" was applied to have a dried film thickness of 3 μm, prebaked, exposed to a high voltage mercury lamp through a circuit pattern, developed by developing liquid and rinse liquid, dried and postbaked to form resist on the areas other than the land areas. Then, silver was vapor deposited to the thickness of 500 A and the resist was removed by removing liquid. The silver vapor deposited on the resist was simultaneously removed. Copper was electroless plated on the remaining vapor deposited silver to the thickness of 5 μm using Shipley electroless copper plating bath "CP-70". The resulting patterned thin film was electroplated with copper to the thickness of 60 μm using Harshaw-Murata phrophosphoric acid copper plating bath under the condition of a cathode current density of 14 A/dm². The resulting fine patterned thick film conductor structure had uniform film thickness (within ±5%), the conductor-to-conductor spacing of 20 μm and the circuit density of 12 lines/mm. A three-layered (Ag-Cu-Cu) stripe-patterned conductor structure was formed in this manner.

EXAMPLE 4

On both sides of Esso Chemical polyparabanic acid film "Tradron" (having a dimension of 5 cm×5 cm and a thickness of 25 μm), Bostik phenol resin-nitrile rubber adhesive material "XA-564-4" was applied to have dried thickness of 5 μm on each side, and heated to 180° C. for 30 minutes. Then, thru-holes were punched.

Thereafter, Eastman Kodak negative photoresist "Microresist 752" was applied to have dried film thickness of 3 μm on each side, prebaked, exposed to a high voltage mercury lamp through a circuit pattern mask, developed by developing liquid and rinse liquid, dried and postbaked to form resist on the areas other than the land areas.

Then, copper was vapor deposited on both sides and the resist was removed by removing liquid. The vapor deposited copper on the resist was simultaneously removed. Then, copper was electroless plated on the remaining vapor deposited copper to the thickness of 3 μm using Muromachi Kagaku Kogyo Co. Ltd. electroless copper plating bath "MK400". The resulting patterned thin film was electroplated with copper using Harshaw-Murata pyrophosphoric acid copper plating both to the thickness of 50 μm under the condition of the cathode current density of 10 A/dm². The resulting fine-patterned thick film conductor structure having circuit patterns on both sides and interconnected by thru-hole connections had the film thickness with the uniformity within ±5% variance, the conductor-to-conductor spacing of 30 μm and the circuit density of 12 lines/mm. A Cu-Cu-Cu multilayered stripe-patterned conductor structure was formed.

EXAMPLE 5

Applied to Dupont polyimide film "Kapton" (having a dimension of 5 cm×5 cm and a thickness of 25 μm) was Bostik phenol resin-nitrile rubber adhesive material "XA-564-4" to the thickness of 5 μm (dried film thickness). It was heated to 180° C. for 30 minutes. Then, copper was vapor deposited to the thickness of 50 A and Eastman Kodak negative photoresist "Microresist 752" was applied to have a dried film thickness of 5 μm, prebaked, exposed to a high voltage mercury lamp through a circuit pattern, developed by developing liquid and rinse liquid, dried and postbaked to form resist on the areas other than the land areas.

Then, copper was electroless plated on the land areas to the thickness of 5 μm using Shipley electroless copper plating bath "CP-70", and the resist was removed by removing liquid. The exposed vapor deposited copper was etched away by hydrochrolic acid solution of ferric chloride. The resulting patterned thin film was electroplated with copper to the thickness of 120 μm using Harshaw-Murata pyrophosphoric acid copper plating bath under the condition of a cathode current density of 14 A/dm². The resulting of the stripe-patterned thick film conductor structure had uniform film thickness, the conductor-to-conductor spacing of 7 μm and the circuit density of 8 lines/mm.

EXAMPLE 6

On both sides of Esso Chemical polyparabanic acid film "Tradron" (having a dimension of 5 cm×5 cm and a thickness of 25 μm), Bostik phenol resin-nitril rubber adhesive material "XA-564-4" was applied to have a dried thickness of 5 μm on each side and heated at 180° C. for 10 minutes. Then, thru-holes were punched. Then, copper was vapor deposited on both sides to the thickness of 0.3 μm. Kodak negative photoresist "Microresist 752" was applied to have a dried film thickness of 3 μm on each side, prebaked, exposed to a high voltage mercury lamp through a circuit pattern mask, developed by developing liquid and rinse liquid, dried and postbaked to form resist on the areas other than the land areas. Then, copper was electroless plated on the land areas to the thickness of 3 μm using Muromachi Kagaku Kogyo Co. Ltd. electroless copper plating bath "MK400". The resist was then removed by removing liquid and the exposed vapor deposited copper was etched away by hydrochloric acid solution of ferric chloride. The resulting patterned thin film was electroplated with copper dusing Harshaw-Murata pyrophosphoric acid copper plating bath to the thickness of 100 μm under the condition of the cathode current density of 10 A/dm². The resulting fine-patterned thick film conductor structure having circuit patterns on both sides and interconnected by thru-hole connections had the film thickness with the uniformity within ±5% variance, the conductor-to-conductor spacing of 8 μm and the circuit density of 10 lines/mm. A multilayered stripe-patterned conductor structure was formed. The structure is useful for high-packaging wiring boards.

EXAMPLE 7

Dupont polyimide film "Kapton" (having a dimension of 5 cm×5 cm and a thickness of 25 μm) was surface treated in the same manner as in the Example 1, and electroless copper plating (film thickness 5 μm) was formed thereon, a stripe-patterned thin film conductor structure having a film thickness of 5 μm was formed thereon, and copper was pulse-plated to the thickness of 120 μm using Harshaw-Murata pyrophosphoric acid copper plating bath under the condition of a cathode current density of 25 A/dm². The resulting fine stripe-patterned thick film conductor structure had the film thickness with the uniformity within ±5% variance, the conductor-to-conductor spacing of 20 μm and the circuit density of 10 lines/mm.

EXAMPLE 8

On both sides of Esso Chemical polyparabanic acid film "Tradron" (having a dimension of 5 cm×5 cm and a thickness of 25 μm), Bostik phenol resin-nitrile rubber adhesive material "XA-564-4" was applied to have dried thickness of 5 μm on each side. It was drilled and nickel was vapor deposited thereon. The resulting thin film conductor structure having the film thickness of 0.3 μm was masked with photoresist (having the film thickness of 5 μm) except the land areas. Then, copper was pulse-plated to the thickness of 170 μm using Harshaw-Murata pyrophosphoric acid copper plating bath under the condition of a cathode current density of 30 A/dm². The nickel thin film on the areas other than the land areas was then etched away. The resulting fine stripe-patterned conductor structure had the film thickness with the uniformity within ±3% variance, the conductor-to-conductor spacing of 10 μm and the circuit density of 10 lines/mm.

EXAMPLE 9

The same process as in the Example 7 was conducted, except electroless nickel plating process and electroplating process by nickel sulfate plating bath. The resulting fine-patterned thick film conductor structure had similar characteristics to those in Example 7.

EXAMPLE 10

The same process as in the Example 7 was conducted, except that tin sulfate plating bath was used under the condition of a cathode current density of 15 A/dm². The resulting fine-patterned thick film conductor structure had similar characteristics to those in Example 7.

EXAMPLE 11

The present example relates to a manufacturing process in which consideration was paid to eliminate a potential difference between conductors. Dupont polyimide film "Kapton" (having a film thickness of 25 μm) was surface treated and electroless plated 1 to the thickness of 5 μm) in the same manner as in Example 1 to form a thin film conductor structure having the film thickness of 5 μm. Then, like in Example 1, resist was applied to the areas other than the spiral land area and copper was plated in a spiral pattern to the thickness of 70 μm using Harshaw-Murata pyrophosphoric acid copper plating bath under the condition of a cathode current density of 14 A/dm². Then, the resist was removed by removing liquid and the thin film conductor layer on the areas other than the spiral land areas was etched away by 20% by weight ammonium persulfate solution. It was then heated to 150° C. for 30 minutes. The resulting fine spiral-patterned thick film conductor structure had the conductor width of 85 μm, the conductor-to-conductor spacing of 15 μm, the conductor thickness of 65 μm and the uniform film thickness with the uniformity within ±3% variance.

COMPARATIVE EXAMPLE 1

The same process as in Example 1 was conducted, except that the cathode current density was 1 A/dm². Shortcircuiting occurred and a fine-patterned conductor structure was not produced.

COMPARATIVE EXAMPLE 2

The same process as in Example 1 was conducted, except that the film thickness of electroless plating was 20 μm. Shortcircuits occurred and fine-patterned conductor structure was not produced. A critical film thickness in Example 1 was 13.5 μm.

What is claimed is:

1. A fine-patterned thick film conductor structure having conductors formed on an insulating substrate, said conductors having a film thickness of 35-200 μm and a circuit density of no less than 5 lines/mm.

2. A fine-patterned thick film conductor structure according to claim 1 wherein said conductors comprise electroplated layers of thin film conductors each having a thickness of 0.1-10 μm.

3. A fine-patterned thick film conductor structure according to claim 1 or 2 wherein said conductors have conductor-to-conductor spacing of 0.5-100 μm.

4. A fine-patterned thick film conductor structure according to claim 1 or 2, wherein said conductors have a film thickness-to-interspacing ratio of no less than 1.4.

5. A fine-patterned thick film conductor structure according to claim 1 or 2, wherein said conductors are formed in spiral pattern.

6. A fine-patterned thick film conductor structure according to claim 1 or 2, wherein said conductors are made of copper.

7. A fine-patterned thick film conductor structure according to claim 1 or 2, wherein said insulating substrate is a polymer film.

8. A fine-patterned thick film conductor structure according to claim 1 or 2, wherein said conductors are formed on both sides of said insulating substrate.

9. A fine-patterned thick film conductor structure according to claim 8, wherein said conductors are interconnected by thru-hole connections.

10. A fine-patterned thick film coil comprising: an insulating substrate and a coil conductor pattern formed on the insulating substrate said conductors pattern having a film thickness of 35-200 μm, conductor-to-conductor spacing of 0.5-100 μm, a film thickness-to-interspacing ratio of no less than 1.4 and a circuit density of no less than 5 lines/mm.

11. A fine-patterned thick film coil comprising: an insulating substrate and a coil conductor pattern formed on the insulating substrate by electroplating under a cathode current density of at least 3 A/dm², the conductor pattern having a thickness of 35 to 200 μm and comprising electroplated layers of thin fim conductors each having a thickness of 0.1 to 10 μm and a circuit density of no less than 5 lines/mm.

* * * * *

UNITED STATES PATENT AND TRADEMARK OFFICE
CERTIFICATE OF CORRECTION

PATENT NO. : 4,392,013  Page 1 of 2
DATED : July 5, 1983
INVENTOR(S) : Kaoru Ohmura et al It is certified that error appears in the above-identified patent and that said Letters Patent is hereby corrected as shown below:

Col. 1, line 29  Delete "of" and insert --or--
Col. 1, line 59  Insert omitted paragraph:

--It is another object of the present invention to provide a fine-patterned thick film conductor structure having a high reliability and a method for manufacturing the same.--

Col. 2, line 3  Delete "dem$^2$" and insert --dm$^2$--
Col. 5, line 33  Delete "A-1" and insert --Å-1--
Col. 5, line 50  Delete "A-1" and insert --Å-1--
Col. 7, line 41  Delete "A" and insert --Å--
Col. 7, line 49  Delete "phrophosphoric" and insert --pyrophosphoric--
Col. 8, line 29  Delete "50A" and insert --500Å--

UNITED STATES PATENT AND TRADEMARK OFFICE
CERTIFICATE OF CORRECTION

PATENT NO. : 4,392,013

DATED : July 5, 1983

INVENTOR(S) : Kaoru Ohmura et al

It is certified that error appears in the above-identified patent and that said Letters Patent is hereby corrected as shown below:

Col. 8, line 45      Delete "of the" and insert --fine--

Col. 9, line 3      Delete "dusing" and insert --using--

Signed and Sealed this

Twenty-ninth Day of November 1983

[SEAL]

Attest:

Attesting Officer

GERALD J. MOSSINGHOFF

Commissioner of Patents and Trademarks